(12) United States Patent
Wang et al.

(10) Patent No.: US 10,636,744 B2
(45) Date of Patent: Apr. 28, 2020

(54) MEMORY DEVICE INCLUDING ALIGNMENT MARK TRENCH

(71) Applicant: UNITED MICROELECTRONICS CORP., Hsin-Chu (TW)

(72) Inventors: Meng-Jun Wang, Taichung (TW); Jiunn-Hsiung Liao, Tainan (TW); Yu-Tsung Lai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/059,046

(22) Filed: Aug. 9, 2018

(65) Prior Publication Data

US 2020/0051922 A1 Feb. 13, 2020

(51) Int. Cl.
| | |
|---|---|
| *H01L 23/544* | (2006.01) |
| *H01L 23/528* | (2006.01) |
| *G11C 11/16* | (2006.01) |
| *H01L 43/08* | (2006.01) |
| *H01L 27/11526* | (2017.01) |
| *H01L 43/02* | (2006.01) |

(52) U.S. Cl.
CPC .......... *H01L 23/544* (2013.01); *H01L 23/528* (2013.01); *G11C 11/161* (2013.01); *H01L 27/11526* (2013.01); *H01L 43/02* (2013.01); *H01L 43/08* (2013.01)

(58) Field of Classification Search
CPC ..... H01L 23/544; H01L 23/528; H01L 43/02; H01L 27/11526; H01L 43/08
USPC ........................................................ 257/797
See application file for complete search history.

(56) References Cited

U.S. PATENT DOCUMENTS

| | | | |
|---|---|---|---|
| 5,786,260 A | 7/1998 | Jang | |
| 5,889,335 A * | 3/1999 | Kuroi | ................. H01L 21/0274 |
| | | | 257/797 |
| 6,215,197 B1 | 4/2001 | Iwamatsu | |
| 6,420,250 B1 | 7/2002 | Cho | |
| 6,774,452 B1 | 8/2004 | Ramkumar | |
| 6,939,777 B2 * | 9/2005 | Ohto | ..................... H01L 23/544 |
| | | | 257/E23.179 |
| 6,987,322 B2 * | 1/2006 | Chen | ..................... G03F 9/7076 |
| | | | 257/750 |
| 7,589,022 B2 * | 9/2009 | Kim | .................... H01L 21/3212 |
| | | | 257/E21.214 |

(Continued)

*Primary Examiner* — Mohammad M Hoque
(74) *Attorney, Agent, or Firm* — Winston Hsu

(57) ABSTRACT

A memory device includes an insulation layer, an interconnection structure disposed in the insulation layer, a dielectric layer disposed on the insulation layer and the interconnection structure, a connection hole disposed on the interconnection structure and penetrates the dielectric layer, an alignment mark trench penetrating the dielectric layer on a peripheral region, a first patterned conductive layer, and a patterned memory material layer. The first patterned conductive layer includes a connection structure at least partly disposed in the connection hole and a first pattern disposed in the alignment mark trench. The patterned memory material layer includes a first memory material pattern disposed on the connection structure and a second memory material pattern disposed in the alignment mark trench. Manufacturing yield and alignment condition of forming the memory device may be improved by disposing a part of the first patterned conductive layer in the alignment mark trench.

20 Claims, 11 Drawing Sheets

(56) References Cited

U.S. PATENT DOCUMENTS

| | | | |
|---|---|---|---|
| 2006/0001065 A1* | 1/2006 | Heo | H01L 27/24 257/296 |
| 2018/0096947 A1 | 4/2018 | Lee | |
| 2019/0088493 A1* | 3/2019 | Watanabe | H01L 21/30608 |

* cited by examiner

MEMORY DEVICE INCLUDING ALIGNMENT MARK TRENCH

BACKGROUND OF THE INVENTION

1. Field of the Invention

The present invention relates to a memory device, and more particularly, to a memory device including an alignment mark trench.

2. Description of the Prior Art

The manufacture of integrated circuits keeps improving as the related technologies progress. Many kinds of electric circuits may be integrated and formed on a single chip. The semiconductor processes for forming integrated circuits including semiconductor devices and/or memory devices may include many steps, such as a deposition process for forming a thin film, a photoresist coating process, an exposure process, and a develop process for forming a patterned photoresist, and an etching process for patterning the thin film. In the exposure process, a photomask having a pattern to be formed has to be aligned with a base layer pattern on a substrate for transferring the pattern to a specific location on the substrate. The alignment marks may be used to assist the alignment in the exposure process and to monitor overlay results for reducing the influence of process variations on the production yield. However, as the semiconductor process becomes more complicated, problems about manufacturing and measurements of alignment marks are generated accordingly and have to be solved.

SUMMARY OF THE INVENTION

A memory device is provided in the present invention. A part of a first patterned conductive layer is a connection structure disposed in a connection hole on a memory cell region, and another part of the first patterned conductive layer is disposed in an alignment mark trench on a peripheral region. Therefore, the connection hole and the alignment mark trench may be formed by the same process for improving the alignment condition between the connection structure and other structures subsequently formed on the connection structure. Additionally, the first patterned conductive layer disposed in an alignment mark trench may be used to improve related process issues, and the manufacturing yield of the memory device may be enhanced accordingly.

According to an embodiment of the present invention, a memory device is provided. The memory device includes an insulation layer, an interconnection structure, a dielectric layer, a connection hole, an alignment mark trench, a first patterned conductive layer, and a patterned memory material layer. A memory cell region and a peripheral region are defined on the insulation layer. The interconnection structure is disposed in the insulation layer. The dielectric layer is disposed on the insulation layer and the interconnection structure. The dielectric layer is disposed on the memory cell region and the peripheral region. The connection hole is disposed on the interconnection structure and penetrates the dielectric layer on the memory cell region. The alignment mark trench penetrates the dielectric layer on the peripheral region. The first patterned conductive layer is disposed on the insulation layer. The first patterned conductive layer includes a connection structure and a first pattern. The connection structure is at least partly disposed in the connection hole. The first pattern is disposed in the alignment mark trench. The patterned memory material layer is disposed on the insulation layer. The patterned memory material layer includes a first memory material pattern and a second memory material pattern. The first memory material pattern is disposed on the connection structure. The second memory material pattern is disposed in the alignment mark trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of a memory device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

FIGS. 10-13 are schematic drawings illustrating a manufacturing method of a memory device according to a second embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Figure 1:
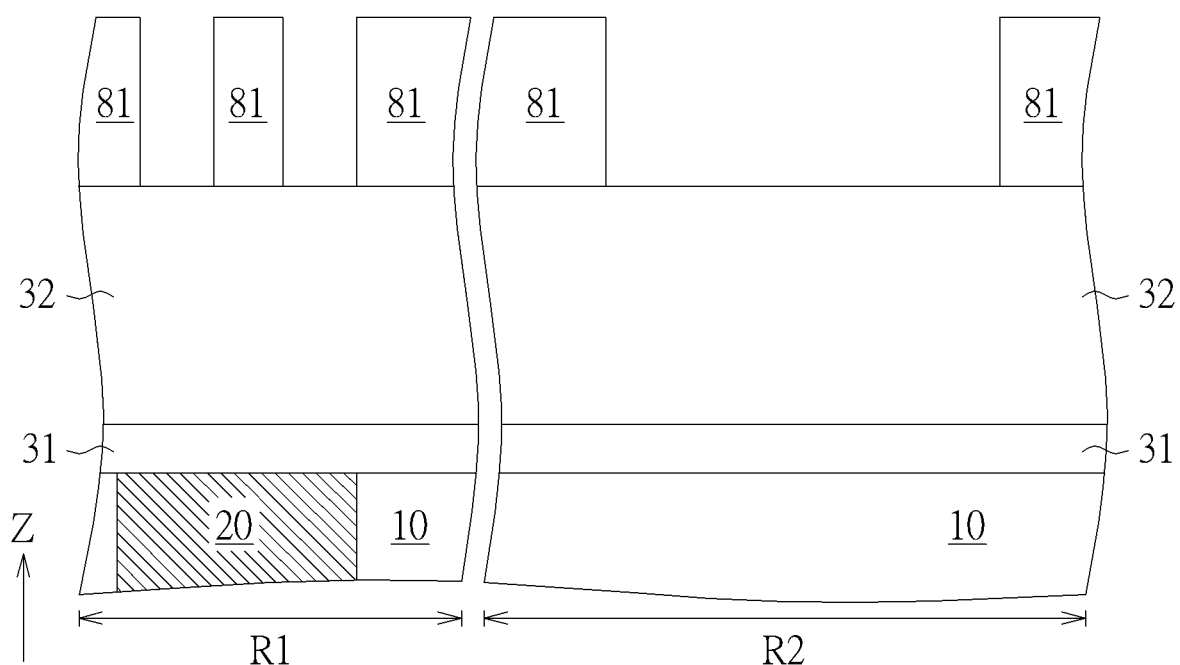
Figure 2:
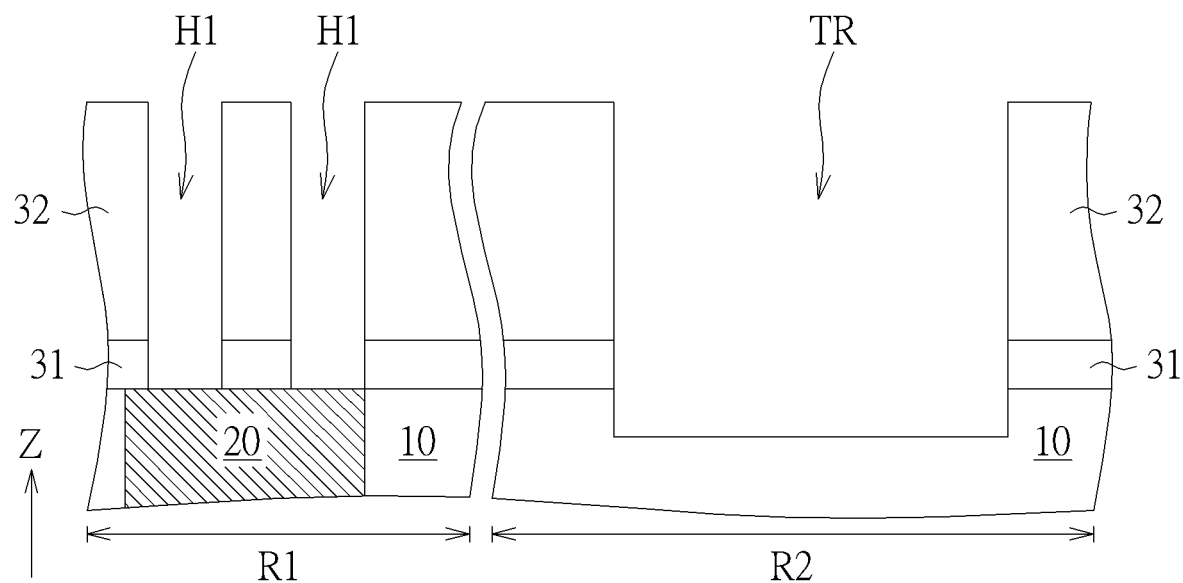
Figure 3:
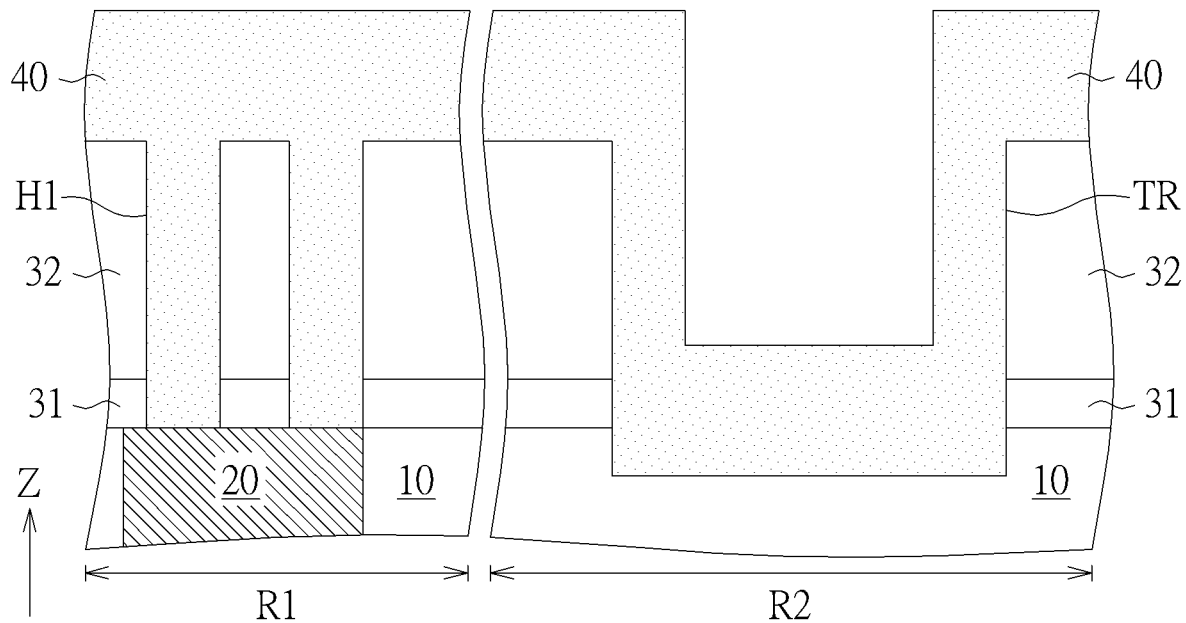
Figure 4:
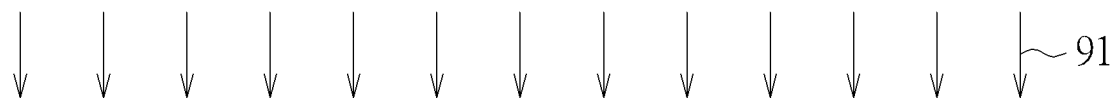
Figure 4:
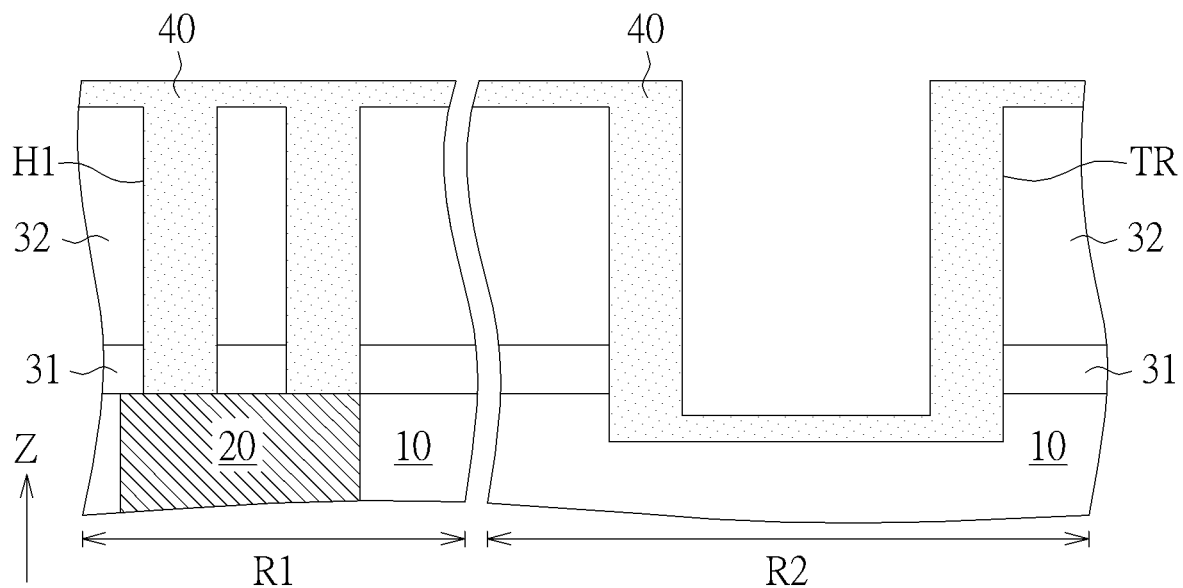
Figure 5:
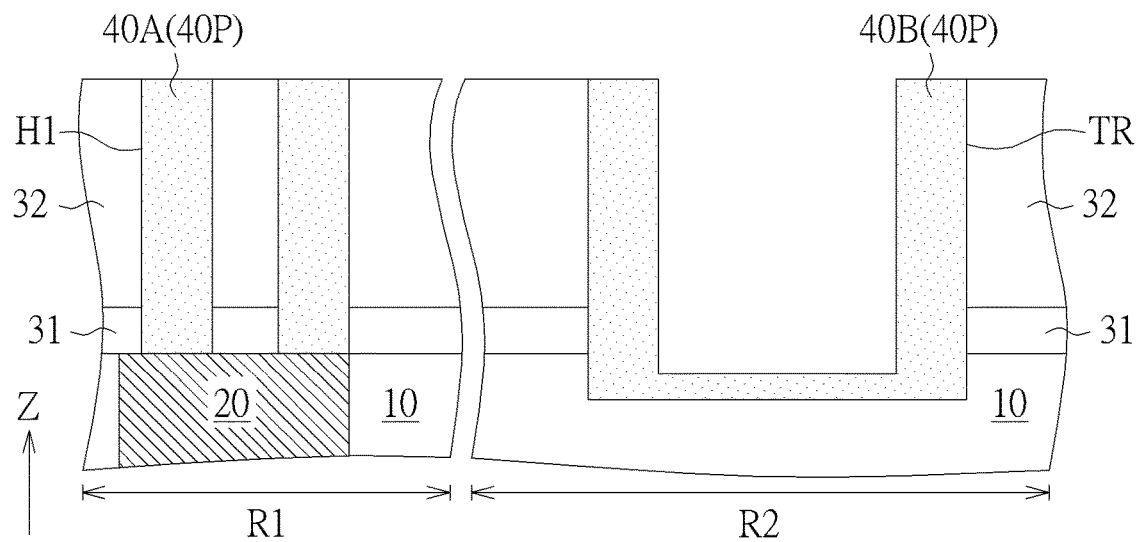
Figure 6:
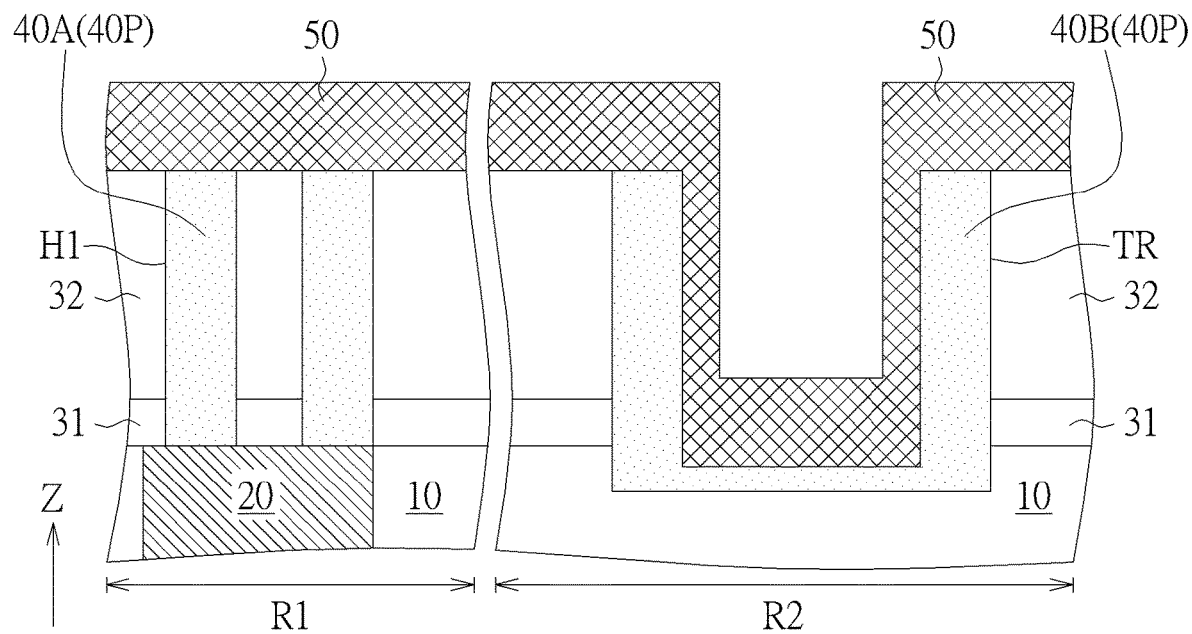
Figure 7:
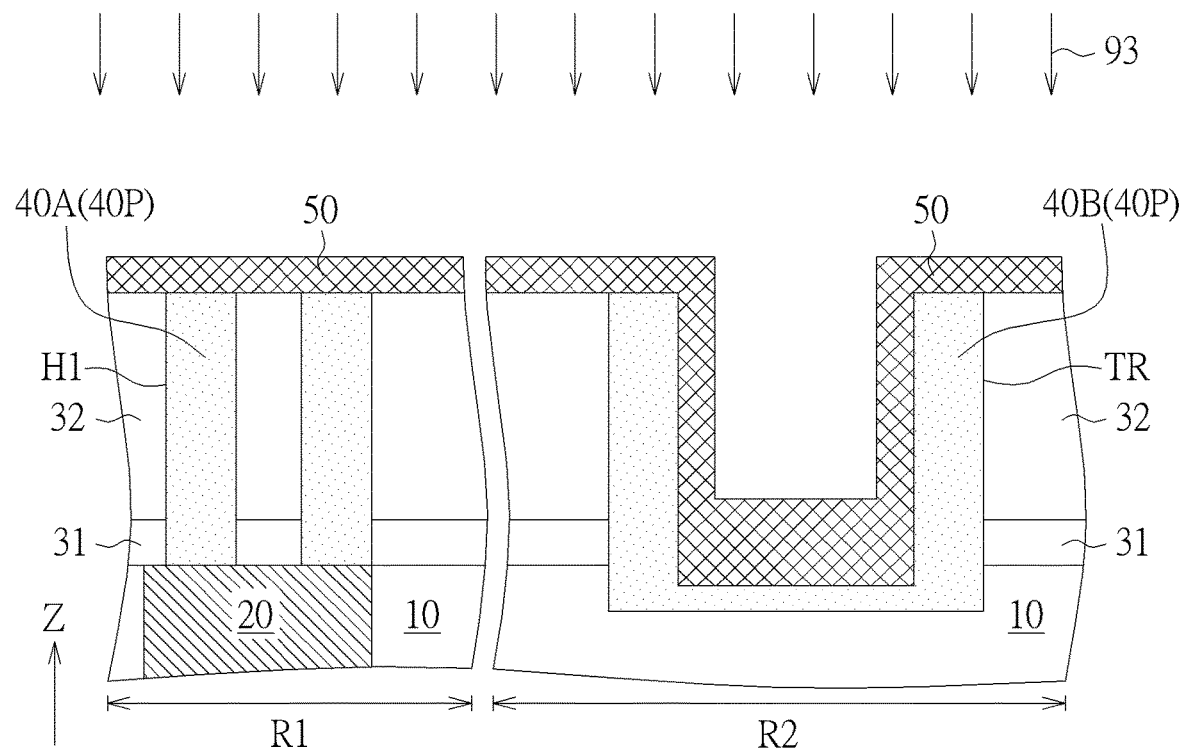
Figure 8:
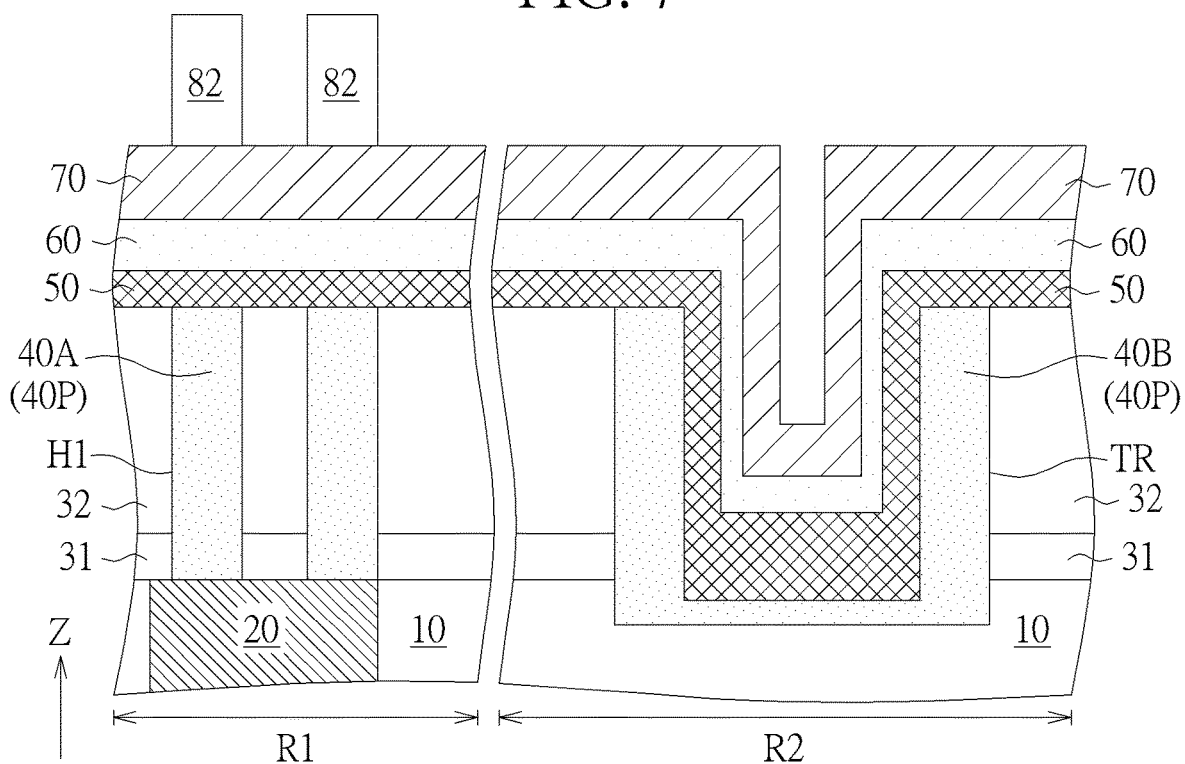
Figure 9:
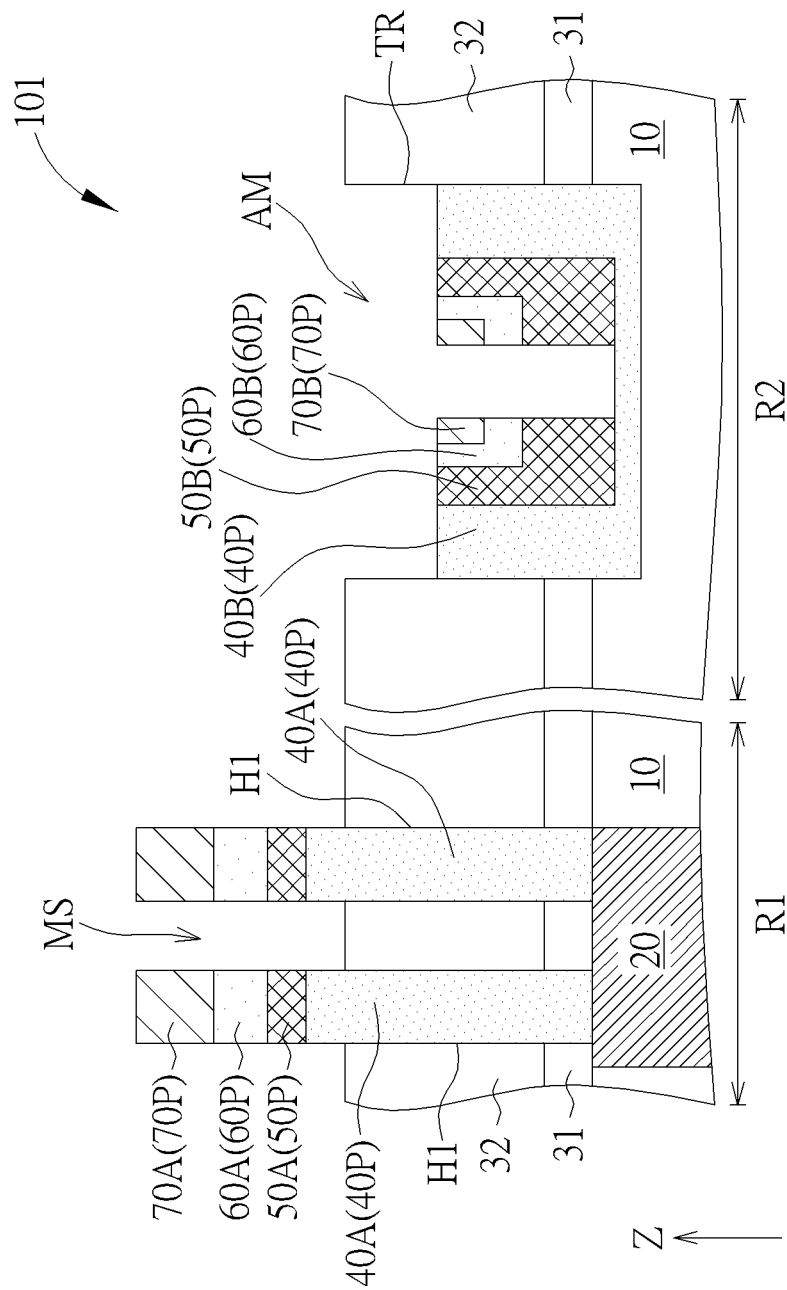

Please refer to FIGS. 1-9. FIGS. 1-9 are schematic drawings illustrating a manufacturing method of a memory device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. The manufacturing method of a memory device in this embodiment may include the following steps. As shown in FIG. 1, an insulation layer 10 is provided, and an interconnection structure 20 is formed in the insulation layer 10. In some embodiments, a memory cell region R1 and a peripheral region R2 may be defined on the insulation layer 10. The interconnection structure 20 may be disposed in the memory cell region R1, and the peripheral region R2 may include an alignment mark region, but not limited thereto. In some embodiments, the insulation layer 10 may be disposed on a substrate (not shown), but not limited thereto. The substrate mentioned above may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. In addition, other devices, such as transistors, may be formed on the substrate before the steps of forming the insulation layer 10 and the interconnection structure 20 according to some considerations, and a memory structure subsequently formed on the interconnection structure 20 may be electrically connected to other devices via the interconnection structure 20 and/or other connection structures, but not limited thereto.

As shown in FIG. 1, one or more dielectric layers may be formed covering the insulation layer 10 and the interconnection structure 20. For example, a first dielectric layer 31 and a second dielectric layer 32 may be sequentially formed covering the insulation layer 10 and the interconnection structure 20 in a thickness direction Z of the insulation layer 10, but not limited thereto. In some embodiments, the insulation layer 10, the first dielectric layer 31, and the second dielectric layer 32 may respectively include dielectric materials such as silicon oxide, silicon nitride, silicon oxynitride, tetraethoxysilane (TEOS), nitrogen doped carbide (NDC), or other suitable dielectric materials, and the material composition of the first dielectric layer 31 may be different from the material composition of the second dielectric layer 32 for etching selectivity concerns in the subsequent processes, but not limited thereto. The interconnection structure 20 may include a conductive material and/or a barrier material. The barrier material mentioned above may include titanium (Ti), titanium nitride (TiN), tantalum (Ta), tantalum nitride (TaN), tungsten silicide (WSi), tungsten nitride (WN), or other suitable barrier materials. The conductive material mentioned above may include aluminum (Al), tungsten (W), copper (Cu), titanium aluminide (TiAl), or other suitable low resistivity materials.

As shown in FIG. 1 and FIG. 2, a connection hole H1 may be formed penetrating the first dielectric layer 31 and the second dielectric layer 32 on the interconnection structure 20 for exposing a part of the interconnection structure 20, and an alignment mark trench TR may be formed penetrating the first dielectric layer 31 and the second dielectric layer 32 on peripheral region R2 for exposing a part of the insulation layer 10. In some embodiments, the connection hole H1 and the alignment mark trench TR may be formed concurrently by the same process, and the width of the alignment mark trench TR may be larger than the width and/or the diameter of the connection hole H1. For example, a first patterned photoresist layer 81 may be formed on the second dielectric layer 32, and an etching process using the first patterned photoresist layer 81 as a mask may be performed to form the connection hole H1 on the memory cell region R1 and the alignment mark trench TR on the peripheral region R2. In some embodiments, a bottom surface of the alignment mark trench TR (such as the bottommost surface of the alignment mark trench TR) may be lower than a bottom surface of the connection hole H1 (such as the bottommost surface of the connection hole H1) and a top surface of the interconnection structure 20 in the thickness direction Z of the insulation layer 10 because the etching rate of the interconnection structure 20 may be lower than the etching rate of the insulation layer 10 in the etching process of forming the connection hole H1 and the alignment mark trench TR, but not limited thereto. Therefore, in some embodiments, the alignment mark trench TR may be partly disposed in the insulation layer 10, but not limited thereto. Additionally, the patterned photoresist layer 81 may be formed by the identical photomask preferably, and the alignment mark trench TR may be used to represent the relative position of the connection hole H1 accordingly, but not limited thereto.

As shown in FIGS. 3-5, a first patterned conductive layer 40P is then formed on the insulation layer 10. The first patterned conductive layer 40P may include a connection structure 40A and a first pattern 40B separated from each other. The connection structure 40A is formed in the connection hole H1, and the first pattern 40B is formed in the alignment mark trench TR. Specifically, the method of forming the first patterned conductive layer 40P may include but is not limited to the following steps. As shown in FIG. 3, a first conductive layer 40 may be formed after the step of forming the connection hole H1 and the alignment mark trench TR. The first conductive layer 40 may be formed on the insulation layer 10, the first dielectric layer 31, the second dielectric layer 32, and the interconnection structure 20. In some embodiment, the connection hole H1 may be fully filled with the first conductive layer 40, and the alignment mark trench TR may not be fully filled with the first conductive layer 40 by controlling the deposition thickness of the first conductive layer 40 because the width of the alignment mark trench TR is larger than the width and/or the diameter of the connection hole H1. The first conductive layer 40 may be a single layer structure or a multiple layer structure including a barrier material and a low resistivity material disposed above the barrier material. The barrier material mentioned above may include titanium, titanium nitride, tantalum, tantalum nitride, tungsten silicide, tungsten nitride, or other suitable barrier materials. The low resistivity material mentioned above may include aluminum, tungsten, copper, titanium aluminide, or other suitable low resistivity materials. As shown in FIG. 3 and FIG. 5, a removing process 92 may be performed to remove the first conductive layer 40 outside the connection hole H1 and the alignment mark trench TR for forming the first patterned conductive layer 40P including the connection structure 40A and the first pattern 40B. Therefore, the connection structure 40A is separated from the first pattern 40B, the connection structure 40A is not directly connected with the first pattern 40B, and the material composition of the connection structure 40A may be identical to the material composition of the first pattern 40B, but not limited thereto. The removing process 92 may include a chemical mechanical polishing (CMP) process or other suitable removing approaches. As shown in FIG. 4 and FIG. 5, in some embodiments, an etching back process 91 may be performed to the first conductive layer 40 before the removing process 92 for reducing the center thickness of the first conductive layer 40 in the alignment mark trench TR, increasing the height difference of an alignment mark subsequently formed on the alignment mark trench TR, and/or lowering the surface roughness of the first conductive layer 40, but not limited thereto. The insulation layer 10 under the alignment mark trench TR may be still covered by the first conductive layer 40 and is not exposed after the etching back process 91 because the etching back process 91 has to be controlled for avoiding damaging the first conductive layer 40 in the connection hole H1. Therefore, in some embodiments, the top surface of the center part of the first pattern 40B may be lower than the bottommost surface of the connection structure 40A in the thickness direction Z of the insulation layer 10, but not limited thereto.

As shown in FIGS. 6-9, a patterned memory material layer 60P may be formed on the insulation layer 10. The patterned memory material layer 60P may include a first memory material pattern 60A and a second memory material pattern 60B separated from each other. The first memory material pattern 60A may be formed on the connection structure 40A, and the second memory material pattern 60B may be formed in the alignment mark trench TR. Additionally, in some embodiments, a second patterned conductive layer 50P and a patterned mask layer 70P may be formed on the insulation layer 10. The second patterned conductive layer 50P may include a bottom electrode 50A and a second pattern 50B. The bottom electrode 50A may be disposed between the connection structure 40A and the first memory material pattern 60A, and the second pattern 50B may be disposed in the alignment mark trench TR and disposed on the first pattern 40B. The patterned mask layer 70P may include a first mask pattern 70A and a second mask pattern 70B. The first mask pattern 70A may be disposed on the first memory material pattern 60A, and the second mask pattern 70B may be disposed in the alignment mark trench TR and disposed on the second memory material pattern 60B. Specifically, the method of forming the second patterned conductive layer 50P, the patterned memory material layer 60P, and the patterned mask layer 70P may include but is not limited to the following steps. As shown in FIGS. 6-8, a second conductive layer 50, a memory material layer 60, and a mask layer 70 may be sequentially formed on the insulation layer 10 after the step of forming the connection structure 40A and the first pattern 40B. In some embodiments, the second conductive layer 50 may include metallic materials, such as tantalum, tantalum nitride, platinum (Pt), ruthenium (Ru), a stack layer of the above-mentioned materials, an alloy of the above-mentioned materials, or other suitable conductive materials. In some embodiments, the mask layer 70 may include insulation materials such as silicon nitride, silicon oxynitride, or other suitable insulation materials or conductive materials. In some embodiments, the memory material layer 60 may include a magnetic tunnel junction (MTJ) film stack layer, or other suitable memory element materials, such as a resistive memory element material, a phase change memory element material, or a ferroelectric memory element material. The MTJ film stack layer mentioned above may include a pinned layer, a first barrier layer, a free layer, a second barrier layer, and a conductive layer sequentially stacked with one another in the thickness direction Z of the insulation layer 10, but not limited thereto. The components of the MTJ film stack may be modified and/or include other material layers according to other design considerations. The pinned layer in the MTJ film stack layer may include a synthetic antiferromagnetic layer and a reference layer. The synthetic antiferromagnetic layer may include antiferromagnetic materials such as iron manganese (FeMn) or cobalt/platinum (Co/Pt) multilayer for a perpendicularly magnetized MTJ, but not limited thereto. The free layer in the MTJ film stack layer and the reference layer in the pinned layer may include ferromagnetic materials such as cobalt, iron (Fe), cobalt-iron (CoFe), cobalt-iron-boron (CoFeB), or other suitable ferromagnetic materials. The first barrier layer and the second barrier layer in the MTJ film stack layer may include insulation materials such as magnesium oxide (MgO), aluminum oxide, or other suitable insulation materials. The material of the conductive layer in the MTJ film stack layer may be similar to the material of the second conductive layer 50, but not limited thereto.

In some embodiments, the second conductive layer 50, the memory material layer 60, and the mask layer 70 may be formed by deposition processes, such as a physical vapor deposition (PVD) process and/or a chemical vapor deposition (CVD) process, but not limited thereto. In some embodiments, a planarization process 93 may be performed to the second conductive layer 50 before the step of forming the memory material layer 60 for lowering the surface roughness of the second conductive layer 50 and/or adjusting the thickness of the second conductive layer 50 on the memory cell region R1, but not limited thereto. The planarization process 93 may include a CMP process or other suitable planarization approaches. Additionally, the first pattern 40B in the alignment mark trench TR may be used to support the second conductive layer 50 around the alignment mark trench TR, and a peeling issue of the second conductive layer 50 around the alignment mark trench TR in the planarization process 93 may be improved accordingly, but not limited thereto.

As shown in FIG. 8 and FIG. 9, in some embodiments, a second patterned photoresist layer 82 may be formed on the mask layer 70, and an etching process using the second patterned photoresist layer 82 as a mask may be performed to etch the mask layer 70, the memory material layer 60, and the second conductive layer 50 for forming the patterned mask layer 70P, the patterned memory material layer 60P, and the second patterned conductive layer 50P described above. Therefore, the bottom electrode 50A may be separated from the second pattern 50B, the first memory material pattern 60A may be separated from the second memory material pattern 60B, and the first mask pattern 70A may be separated from the second mask pattern 70B. In other words, the bottom electrode 50A may not be directly connected with the second pattern 50B, the first memory material pattern 60A may not be directly connected with the second memory material pattern 60B, and the first mask pattern 70A may not be directly connected with the second mask pattern 70B. In addition, the material composition of the bottom electrode 50A may be identical to the material composition of the second pattern 50B, the material composition of the first memory material pattern 60A may be identical to the material composition of the second memory material pattern 60B, and the material composition of the first mask pattern 70A may be identical to the material composition of the second mask pattern 70B, but not limited thereto.

In some embodiments, the insulation layer 10 and the first pattern 40B in the alignment mark trench TR are partially etched by the etching process of forming the patterned mask layer 70P, the patterned memory material layer 60P, and the second patterned conductive layer 50P, an upper portion of the connection structure 40A may be located outside the connection hole H1, and the topmost surface of the first pattern 40B may be lower than the topmost surface of the connection structure 40A in the thickness direction Z of the insulation layer 10, but not limited thereto. Therefore, the bottom electrode 50A, the first memory material pattern 60A, and the first mask pattern 70A formed on the connection structure 40A may be disposed outside the connection hole H1 also, but not limited thereto. It is worth noting that, the materials formed in the alignment mark trench TR (such as the first pattern 40B, the second conductive layer 50, the memory material layer 60, and the mask layer 70) and/or the materials formed above the alignment mark trench TR (such as the second conductive layer 50, the memory material layer 60, and the mask layer 70) may be used as an alignment mark in an exposure process of forming the second patterned photoresist layer 82, and the alignment performance between the connection structure 40A and a memory structure MS including the bottom electrode 50A, the first memory material pattern 60A, and the first mask pattern 70A subsequently formed on the connection structure 40A may be improved because the alignment mark trench TR and the connection hole H1 are formed by the same process.

As shown in FIG. 9, a memory device 101 may be formed by the manufacturing method described above. The memory device 101 in this embodiment may include the insulation layer 10, the interconnection structure 20, the first dielectric layer 31, the second dielectric layer 32, the connection hole H1, the alignment mark trench TR, the first patterned conductive layer 40P, and the patterned memory material layer 60P. The memory cell region R1 and the peripheral region R2 are defined on the insulation layer 10. The interconnection structure 20 is disposed in the insulation layer 10. The first dielectric layer 31 and the second dielectric layer 32 are disposed on the insulation layer 10 and the interconnection structure 20. The first dielectric layer 31 and the second dielectric layer 32 are disposed on the memory cell region R1 and the peripheral region R2. The connection hole H1 is disposed on the interconnection structure 20 and penetrates the first dielectric layer 31 and the second dielectric layer 32 on the memory cell region R1. The alignment mark trench TR penetrates the first dielectric layer 31 and the second dielectric layer 32 on the peripheral region R2. The first patterned conductive layer 40P is disposed on the insulation layer 10. The first patterned conductive layer 40P includes the connection structure 40A and the first pattern 40B. The connection structure 40A is at least partly disposed in the connection hole H1. The first pattern 40B is disposed in the alignment mark trench TR. The patterned memory material layer 60P is disposed on the insulation layer 10. The patterned memory material layer 60P includes the first memory material pattern 60A and the second memory material pattern 60B. The first memory material pattern 60A is disposed on the connection structure 40A. The second memory material pattern 60B is disposed in the alignment mark trench TR.

In some embodiments, the memory device 101 may further include the second patterned conductive layer 50P and the patterned mask layer 70P disposed on the insulation layer 10. The second patterned conductive layer 50P includes the bottom electrode 50A and the second pattern 50B. The bottom electrode 50A is disposed between the connection structure 40A and the first memory material pattern 60A, and the second pattern 50B is disposed in the alignment mark trench TR. The patterned mask layer 70P includes the first mask pattern 70A and the second mask pattern 70B. The first mask pattern 70A is disposed on the first memory material pattern 60A, and the second mask pattern 70B is disposed in the alignment mark trench TR and disposed on the second memory material pattern 60B. In some embodiments, the second pattern 50B may be disposed between the first pattern 40B and the second memory material pattern 60B, and the second memory material pattern 60B may be disposed between the second mask pattern 70B and the first pattern 40B, but not limited thereto. In some embodiments, the memory device 101 may include a memory structure MS composed of the bottom electrode 50A, the first memory material pattern 60A, and the first mask pattern 70A, and an alignment mark structure AM composed of the first pattern 40B, the second pattern 50B, the second memory material pattern 60B, and the second mask pattern 70B, but not limited thereto. In some embodiments, the patterned memory material layer 60P may include a MTJ film stack layer, and the memory device 101 may be regarded as a magnetic random access memory (MRAM) device, but not limited thereto. In some embodiments, the bottom surface of the first pattern 40B (such as the bottom-most surface of the first pattern 40B) may be lower than the bottom surface of the connection structure 40A (such as the bottommost surface of the connection structure 40A) in the thickness direction Z of the insulation layer 10 because the etching rate of the interconnection structure 20 may be lower than the etching rate of the insulation layer 10 in the etching process of forming the connection hole H1 and the alignment mark trench TR, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
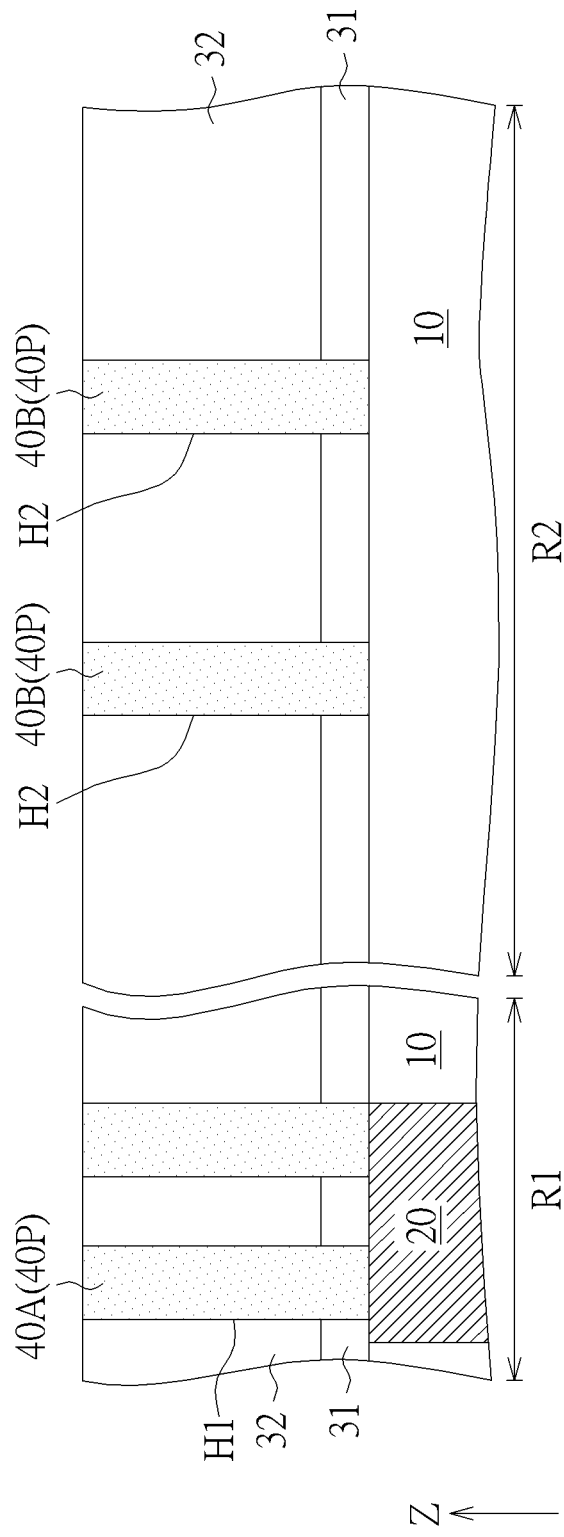
Figure 11:
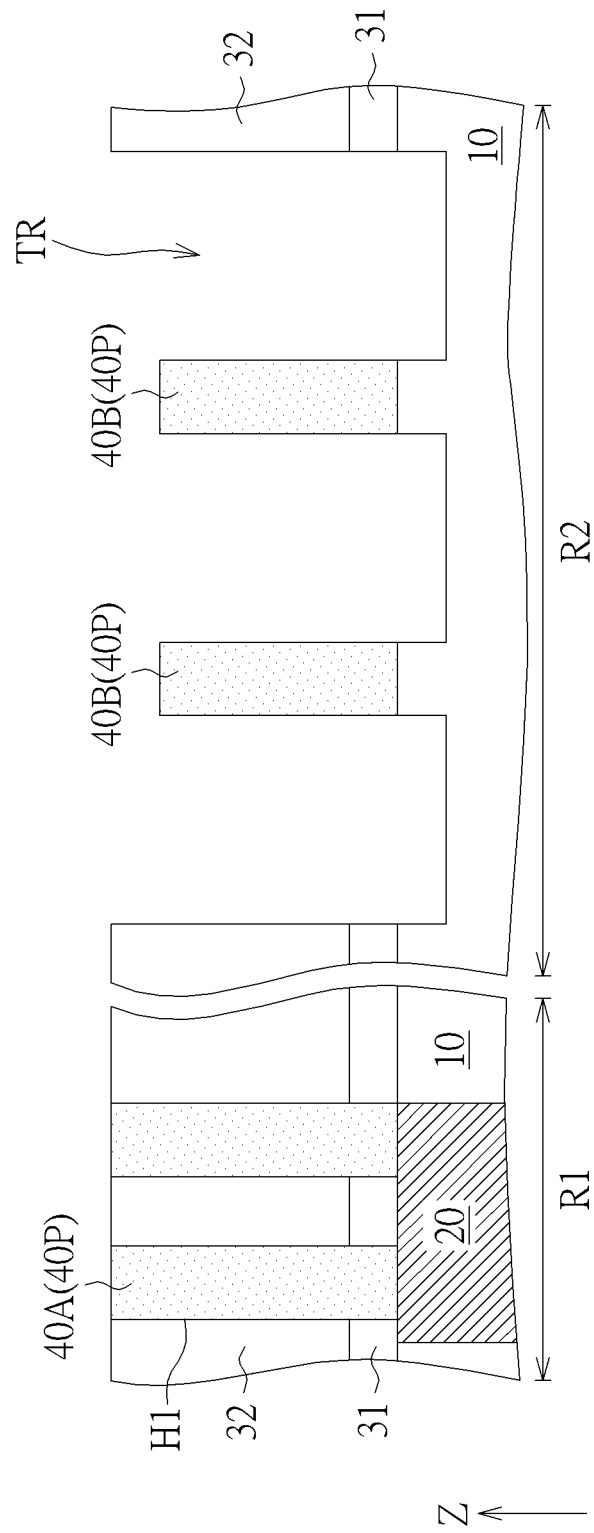
Figure 12:
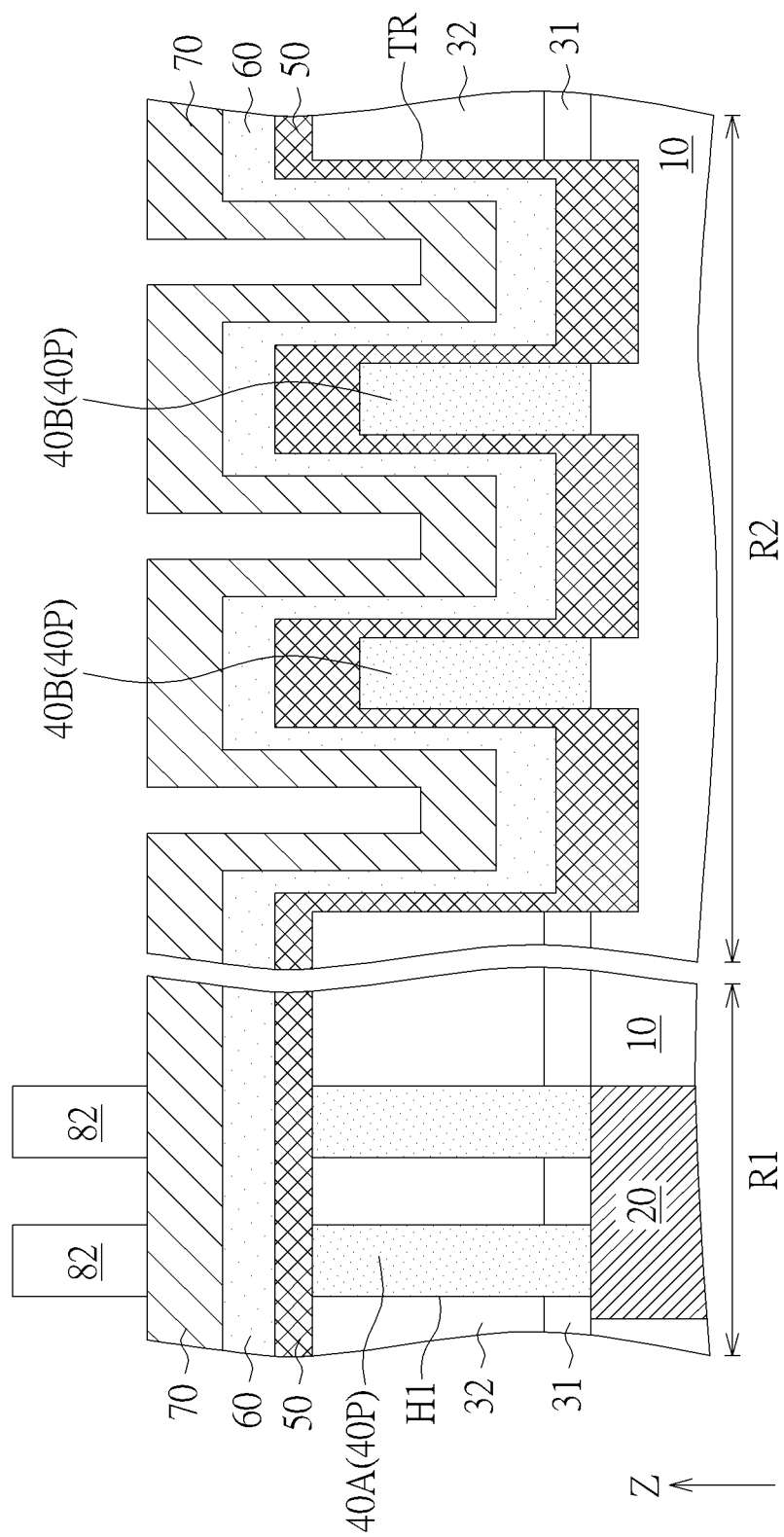
Figure 13:
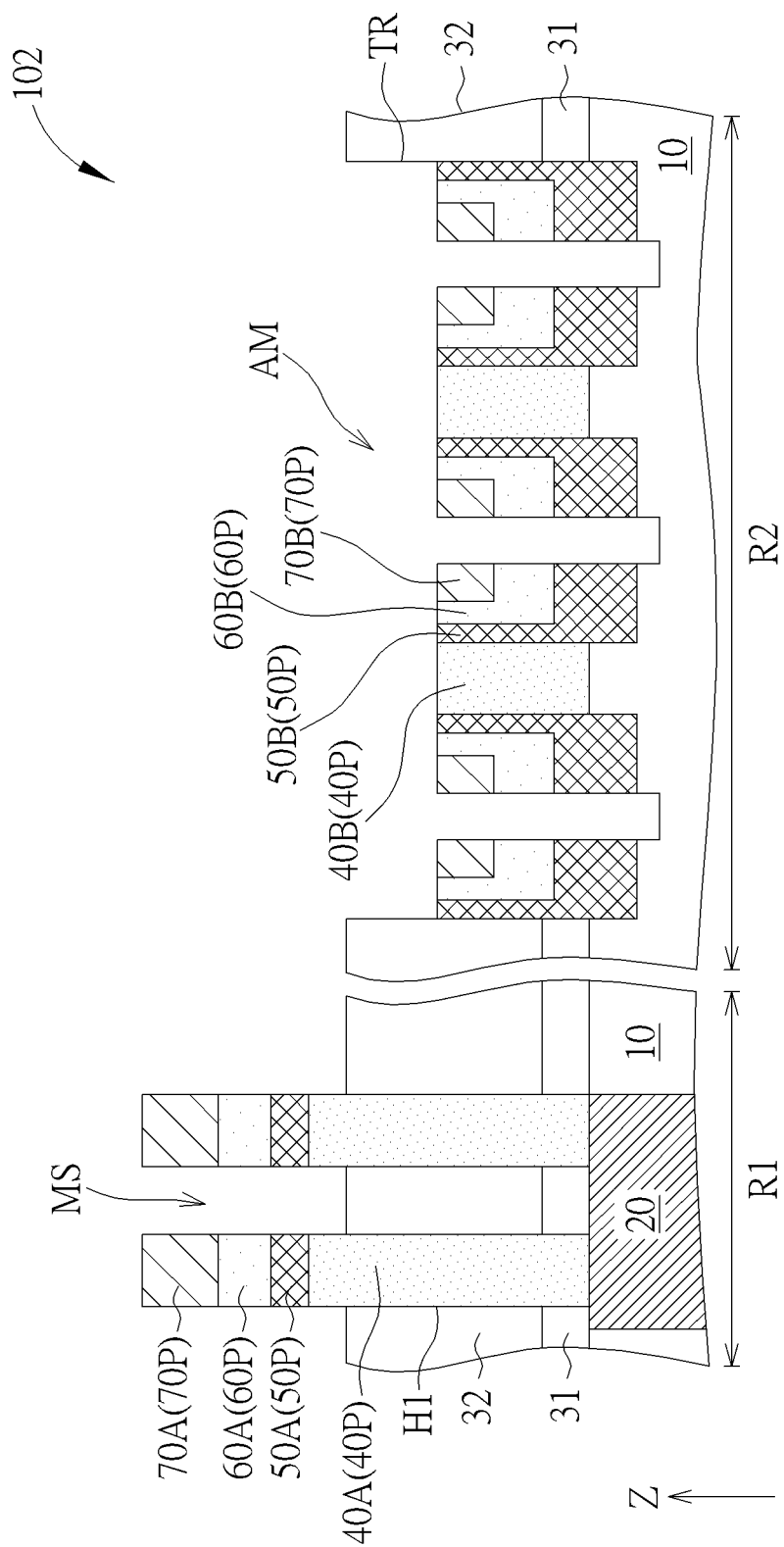

Please refer to FIGS. 10-13. FIGS. 10-13 are schematic drawings illustrating a manufacturing method of a memory device 102 according to a second embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12. The difference between the manufacturing method of the memory device 102 in this embodiment and the manufacturing method of the firs embodiment described above is that, as shown in FIG. 10 and FIG. 11, a dummy hole H2 may be formed penetrating the first dielectric layer 31 and the second dielectric layer 32 on the peripheral region R2 before the step of forming the alignment mark trench TR, and the first pattern 40B may be formed in the dummy hole H2 before the step of forming the alignment mark trench TR. The connection hole H1 and the dummy hole H2 may be formed concurrently by the same process, and the alignment mark trench TR may be formed after the step of forming the connection hole H1 and the dummy hole H2. In some embodiments, the width of the dummy hole H2 may be substantially equal to the width of the connection hole H1, and a plurality of dummy holes H2 and a plurality of first patterns 40B may be formed on the peripheral region R2 for improving the distribution density of the first patterned conductive layer 40P formed over the memory cell region R1 and the peripheral region R2, and that will benefit the uniformity of the above-mentioned removing process performed for forming the connection structure 40A, but not limited thereto. In some embodiments, a part of the first pattern 40B may be removed by the step of forming the alignment mark trench TR, the width of the alignment mark trench TR may be larger than the width of the dummy hole H2, and the first pattern 40B may still be located in the alignment mark trench TR.

As shown in FIGS. 6-8, the second conductive layer 50, the memory material layer 60, the mask layer 70, and the second patterned photoresist layer 82 may be sequentially formed on the insulation layer 10 after the step of forming the alignment mark trench TR. In some embodiments, the second conductive layer 50, the memory material layer 60, and the mask layer 70 may be conformally formed on the first pattern 40B and the surface of the alignment mark trench TR. In some embodiments, the bottommost surface of the alignment mark trench TR may be lower than the bottommost surface of the first pattern 40B and the bottommost surface of the connection structure 40A in the thickness direction Z of the insulation layer 10, and a bottom surface of the second conductive layer 50 in the alignment mark trench TR may be lower than a bottom surface of the first pattern 40B in the thickness direction Z of the insulation layer 10 accordingly. As shown in FIG. 12 and FIG. 13, an etching process using the second patterned photoresist layer 82 as a mask may be performed to etch the mask layer 70, the memory material layer 60, and the second conductive layer 50 for forming the patterned mask layer 70P, the patterned memory material layer 60P, and the second patterned conductive layer 50P. The memory device 102 may be formed by the manufacturing method described above. In some embodiments, a bottom surface of the second pattern 50B (such as the bottommost surface of the second pattern 50B) may be lower than a bottom surface of the first pattern 40B (such as the bottommost surface of the first pattern 40B) in the thickness direction Z of the insulation layer 10, but not limited thereto.

Figure 14:
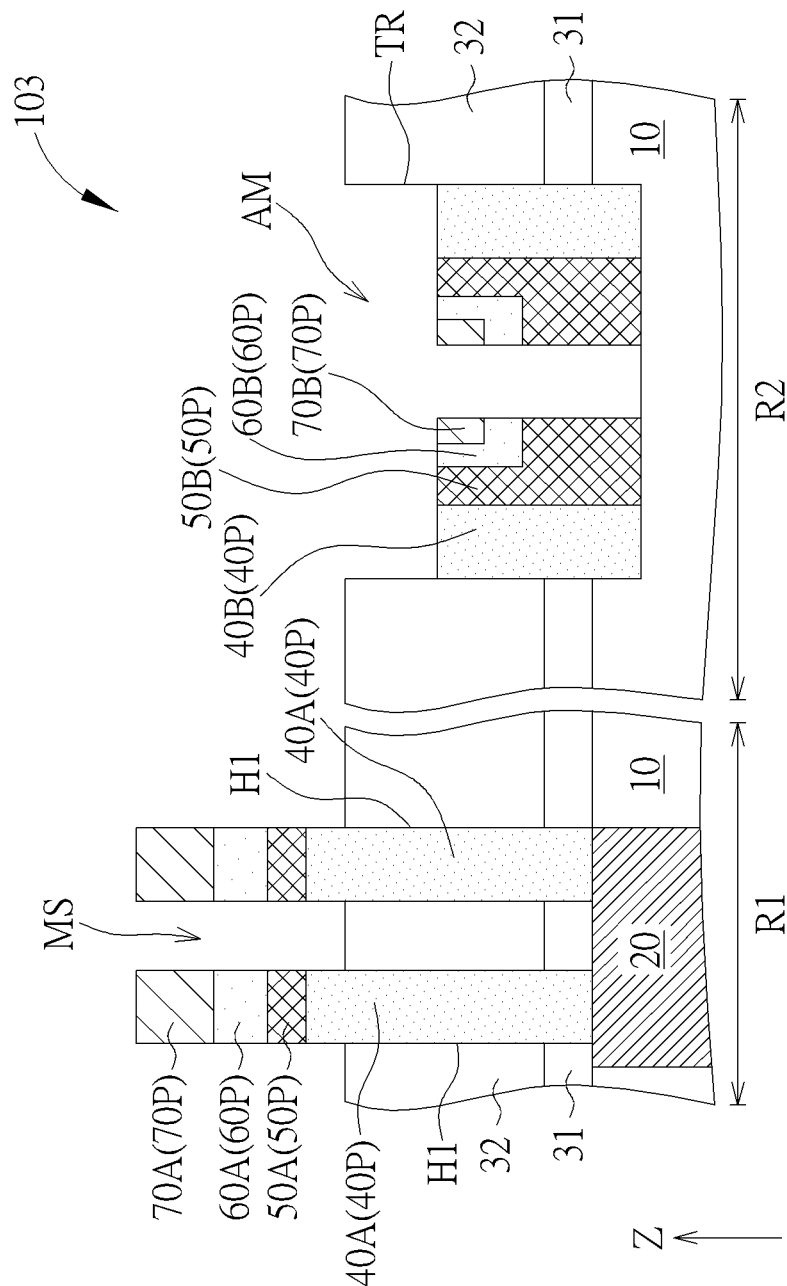
FIG. 14 is a schematic drawing illustrating a memory device according to a third embodiment of the present invention.

Please refer to FIG. 14. FIG. 14 is a schematic drawing illustrating a memory device 103 according to a third embodiment of the present invention. As shown in FIG. 14, the difference between the memory device 103 and the memory device in the first embodiment described above is that a bottom surface of the second pattern 50B (such as the bottommost surface of the second pattern 50B) and a bottom surface of the first pattern 40B (such as the bottommost surface of the first pattern 40B) in this embodiment may be coplanar in the alignment mark trench TR. In other words, the first pattern 40B may not be partly disposed between the second pattern 50B and the insulation layer 10 in the thickness direction Z of the insulation layer 10, and the etching back process 91 described in FIG. 4 may expose a part of the insulation layer 10 under the alignment mark trench TR.

Figure 15:
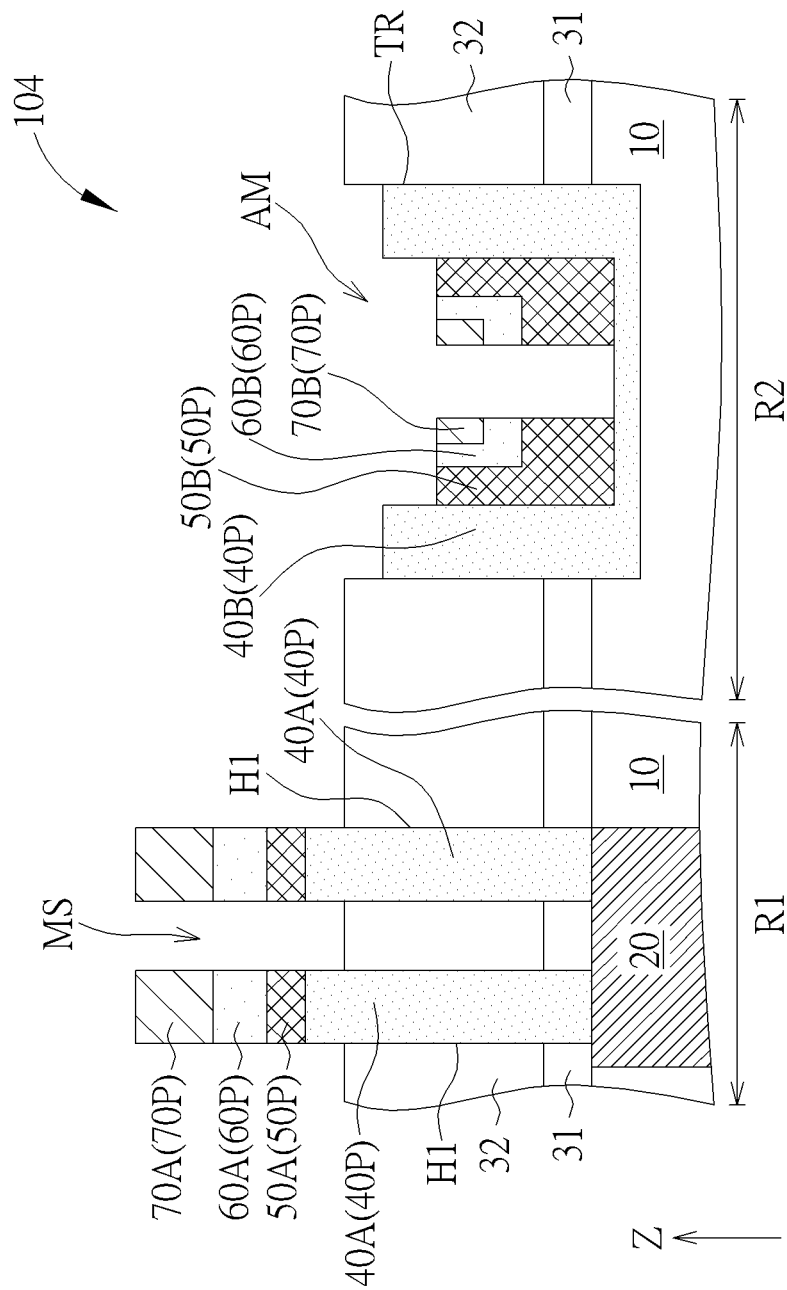
FIG. 15 is a schematic drawing illustrating a memory device according to a fourth embodiment of the present invention.

Please refer to FIG. 15. FIG. 15 is a schematic drawing illustrating a memory device 104 according to a fourth embodiment of the present invention. As shown in FIG. 14, the difference between the memory device 104 and the memory device in the first embodiment described above is that a top surface of the first pattern 40B in the alignment mark trench TR (such as the topmost surface of the first pattern 40B) may be higher than a top surface of the second pattern 50B in the alignment mark trench TR (such as the topmost surface of the second pattern 50B), a top surface of the second memory material pattern 60B in the alignment mark trench TR (such as the topmost surface of the second memory material pattern 60B), and a top surface of the second mask pattern 70B in the alignment mark trench TR (such as the topmost surface of the second mask pattern 70B). In this embodiment, the etching rate of the first pattern 40B in the etching process for forming the patterned mask layer 70P, the patterned memory material layer 60P, and the second patterned conductive layer 50P may be lower than the etching rate of the second conductive layer described above, the etching rate of the memory material layer described above, and the etching rate of the mask layer described above. Additionally, in some embodiments, the bottom surface of the second pattern 50B and the bottom surface of the first pattern 40B may be coplanar in the alignment mark trench TR (such as the condition shown in FIG. 14) when the top surface of the first pattern 40B in the alignment mark trench TR is higher than the top surface of the second pattern 50B, the top surface of the second memory material pattern 60B, and the top surface of the second mask pattern 70B in the thickness direction Z of the insulation layer 10.

To summarize the above descriptions, in the memory device and the manufacturing method thereof according to the present invention, a part of the first patterned conductive layer may be the connection structure disposed in the connection hole on the memory cell region, and another part of the first patterned conductive layer may be the first pattern disposed in the alignment mark trench on the peripheral region. The connection hole and the alignment mark trench may be formed by the same process for improving the alignment condition between the connection structure and other structures subsequently formed on the connection structure. Additionally, the first pattern disposed in the alignment mark trench may be used to support the second conductive layer around the alignment mark trench TR, and a peeling issue of the second conductive layer around the alignment mark trench TR in the planarization process performed to the second conductive layer may be improved. The manufacturing yield of the memory device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory device, comprising:
an insulation layer, wherein a memory cell region and a peripheral region are defined on the insulation layer;
an interconnection structure disposed in the insulation layer;
a dielectric layer disposed on the insulation layer and the interconnection structure, wherein the dielectric layer is disposed on the memory cell region and the peripheral region;
a connection hole disposed on the interconnection structure and penetrating the dielectric layer on the memory cell region;
an alignment mark trench penetrating the dielectric layer on the peripheral region;
a first patterned conductive layer disposed on the insulation layer, the first patterned conductive layer comprising:
a connection structure at least partly disposed in the connection hole; and
a first pattern disposed in the alignment mark trench; and
a patterned memory material layer disposed on the insulation layer, the patterned memory material layer comprising:
a first memory material pattern disposed on the connection structure; and a second memory material pattern disposed in the alignment mark trench.

2. The memory device according to claim 1, wherein the alignment mark trench is partly disposed in the insulation layer, and a bottom surface of the alignment mark trench is lower than a top surface of the interconnection structure in a thickness direction of the insulation layer.

3. The memory device according to claim 1, wherein a bottom surface of the first pattern is lower than a bottom surface of the connection structure in a thickness direction of the insulation layer.

4. The memory device according to claim 1, further comprising:
a second patterned conductive layer disposed on the insulation layer, the second patterned conductive layer comprising:
a bottom electrode disposed between the connection structure and the first memory material pattern; and
a second pattern disposed in the alignment mark trench.

5. The memory device according to claim 4, wherein the second pattern is disposed between the first pattern and the second memory material pattern.

6. The memory device according to claim 4, wherein the bottom electrode and the second pattern are separated from each other.

7. The memory device according to claim 4, wherein the bottom electrode is disposed outside the connection hole.

8. The memory device according to claim 4, wherein a bottom surface of the second pattern is lower than a bottom surface of the first pattern in a thickness direction of the insulation layer.

9. The memory device according to claim 4, wherein a bottom surface of the second pattern and a bottom surface of the first pattern are coplanar.

10. The memory device according to claim 4, wherein a top surface of the first pattern is higher than a top surface of the second pattern.

11. The memory device according to claim 1, further comprising:
a patterned mask layer disposed on the patterned memory material layer, the patterned mask layer comprising:
a first mask pattern disposed on the first memory material pattern; and
a second mask pattern disposed in the alignment mark trench and disposed on the second memory material pattern.

12. The memory device according to claim 11, wherein the second memory material pattern is disposed between the second mask pattern and the first pattern.

13. The memory device according to claim 11, wherein the first mask pattern and the second mask pattern are separated from each other.

14. The memory device according to claim 11, wherein the first mask pattern is disposed outside the connection hole.

15. The memory device according to claim 1, wherein the connection structure and the first pattern are separated from each other.

16. The memory device according to claim 1, wherein the first memory material pattern and the second memory material pattern are separated from each other.

17. The memory device according to claim 1, wherein the first memory material pattern is disposed outside the connection hole.

18. The memory device according to claim 1, wherein the patterned memory material layer is a magnetic tunnel junction (MTJ) film stack layer.

19. The memory device according to claim 1, wherein the peripheral region comprises an alignment mark region.

20. The memory device according to claim 1, wherein the connection structure is disposed between the first memory material pattern and the interconnection structure in a thickness direction of the insulation layer.

* * * * *